(12) United States Patent
Telecco

(10) Patent No.: US 6,518,798 B2
(45) Date of Patent: Feb. 11, 2003

(54) SENSE AMPLIFIER WITH IMPROVED LATCHING

(75) Inventor: Nicola Telecco, Santa Clara, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 09/877,353

(22) Filed: Jun. 7, 2001

(65) Prior Publication Data

US 2002/0186051 A1 Dec. 12, 2002

(51) Int. Cl.[7] .............................................. G01R 19/00
(52) U.S. Cl. ........................................... 327/54; 327/55
(58) Field of Search ............................... 327/50–52, 54, 327/55, 57; 365/205, 207

(56) References Cited

U.S. PATENT DOCUMENTS

| 5,155,397 A | * | 10/1992 | Fassino et al. | 327/55 |
| 5,289,415 A | | 2/1994 | DiMarco et al. | 365/203 |
| 5,426,755 A | * | 6/1995 | Yokouchi et al. | 327/57 |
| 5,552,728 A | * | 9/1996 | Lin | 327/57 |
| 5,939,903 A | * | 8/1999 | Lin | 327/57 |
| 6,018,260 A | | 1/2000 | Gabara | 327/55 |
| 6,130,560 A | * | 10/2000 | Sato | 327/57 |

* cited by examiner

*Primary Examiner*—Terry D. Cunningham
*Assistant Examiner*—Long Nguyen
(74) *Attorney, Agent, or Firm*—Thomas Schneck

(57) ABSTRACT

A sense amplifier that eliminates or substantially attenuates transients at its output node by isolating the output node from the bitline. The sense amplifier incorporates a sense line transistor between the bitline and the output latching circuit in order to strengthen the voltage value at the output node such that it is not affected by the impedance of the bitline. The sense amplifier also consumes less power and is faster because the bitline does not have to be discharged or precharged by the output driver.

20 Claims, 3 Drawing Sheets

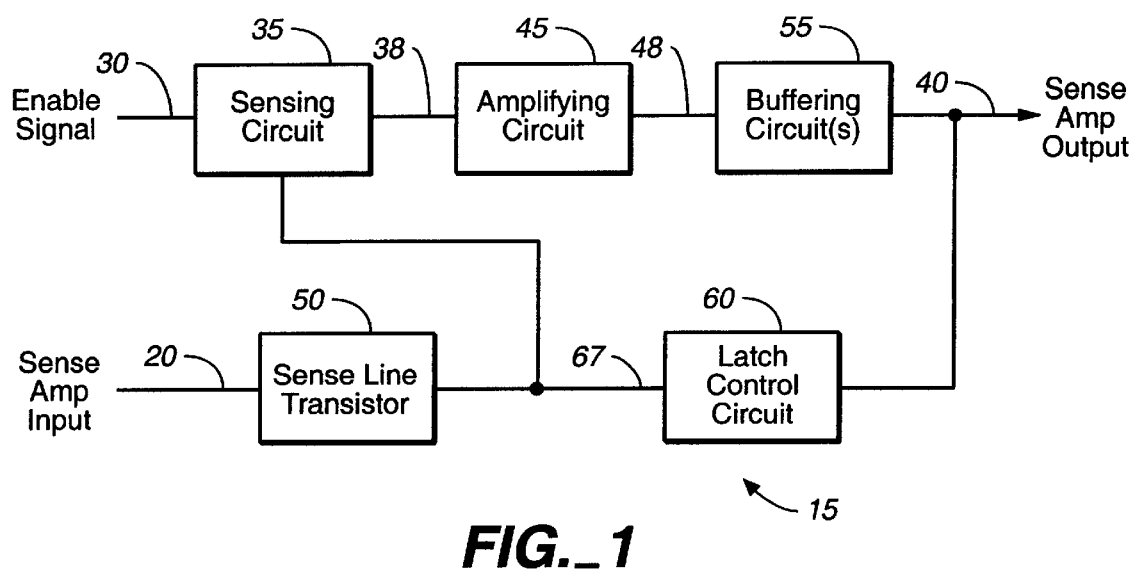
FIG._1

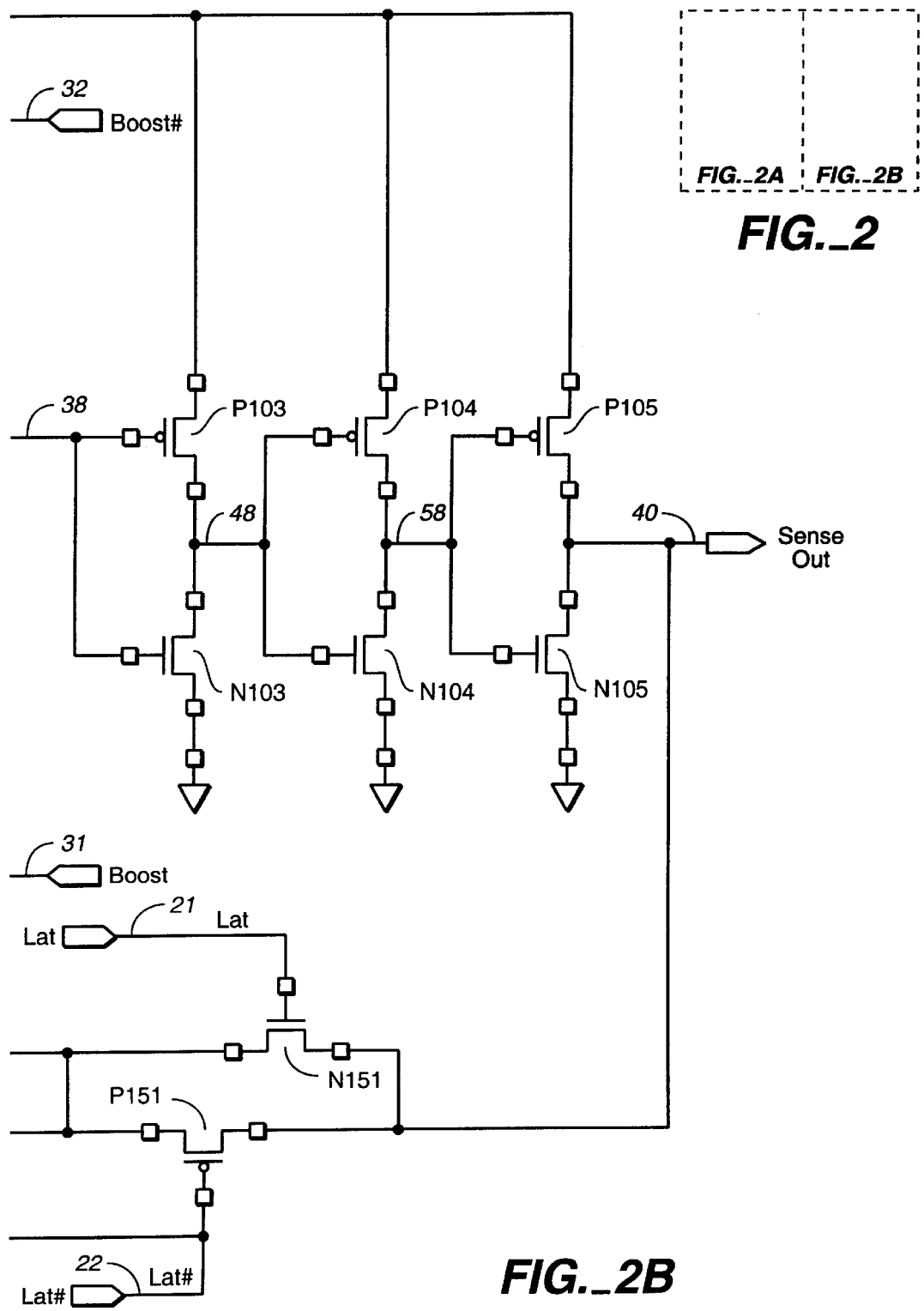
FIG._2
FIG._2B

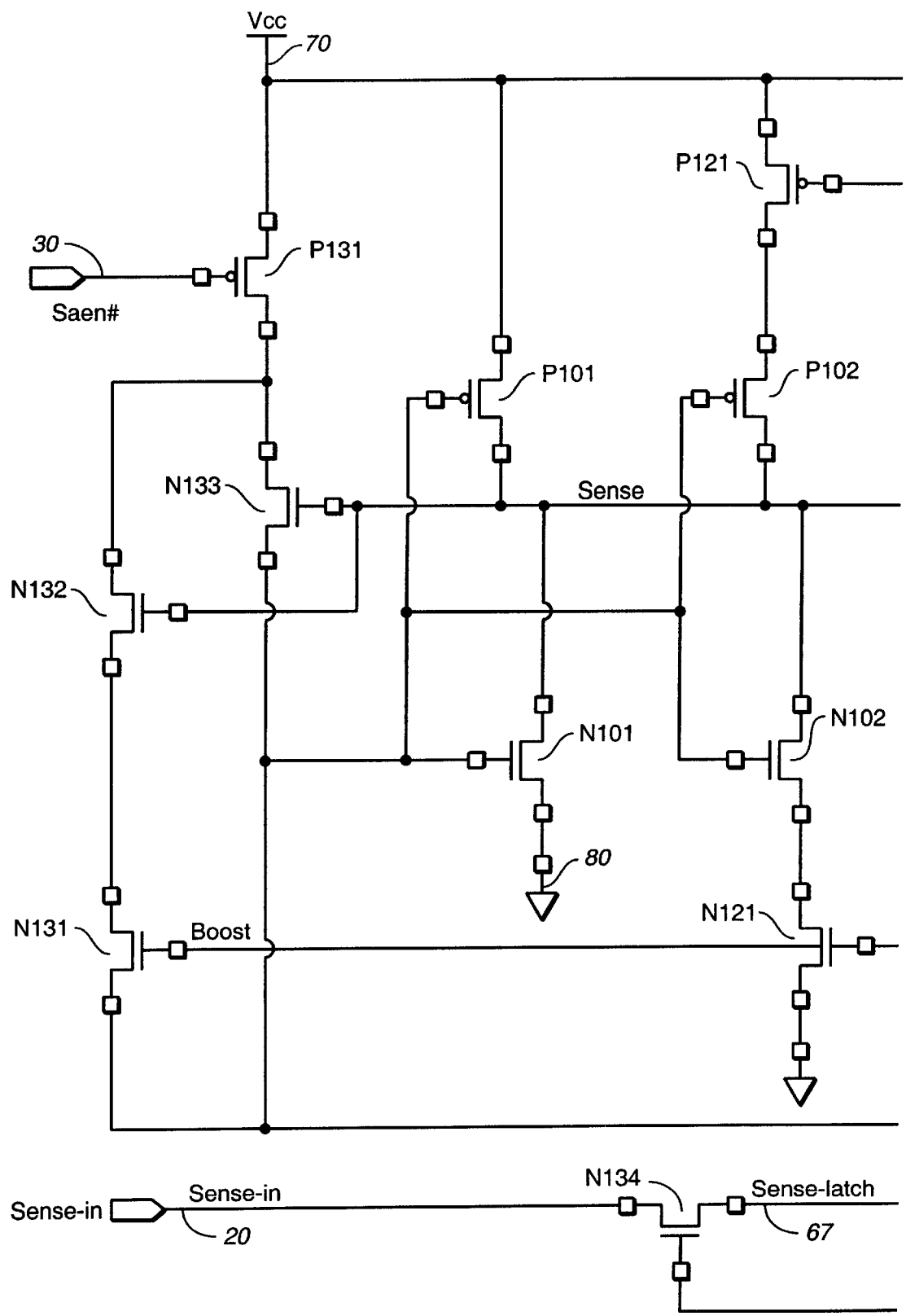
FIG._2A

SENSE AMPLIFIER WITH IMPROVED LATCHING

TECHNICAL FIELD

The present invention relates to sense amplifiers used to sense data in CMOS memory cells, and more specifically, to a latch control circuit within such a sense amplifier.

BACKGROUND ART

In an integrated memory circuit, sense amplifiers are used to improve the speed performance of a memory, and to provide signals which conform with the requirements of driving peripheral circuits within the memory. A sense amplifier is an active circuit that reduces the time of signal propagation from an accessed memory cell to the logic circuit at the periphery of the memory cell array, and converts the arbitrary logic levels occurring on a bitline to the digital logic levels of the peripheral circuits. The sensing part of the sense amplifier detects and determines the data content of a selected memory cell. The sensing may be "nondestructive", wherein the data content of the selected memory cell is unchanged, such as in SRAMs, ROMs and PROMs, or the sensing may be "destructive" wherein the data content of the selected memory cell may be altered by the sense operation, such as in DRAMs.

Many sense amplifier circuits include a latch circuit in order to extend the time period during which a bit read from the memory will be available beyond the end of a particular memory cycle. Some sense amplifier circuits use the latch circuit to reduce power consumption by latching the value of the sense amplifier output and then turning off the sensing circuit during time periods when it is idle.

A continuing challenge in designing sense amplifier circuits is to maintain the stability of the voltage level of the output signal. In many sense amplifier circuits, the sense amplifier output node is connected through a CMOS pass gate to the bitline. Therefore, the sense amplifier output is in full electrical communication with the bitline. The latch circuit is usually connected between the sense amplifier output and the bitline. To latch the output, pull-up and pull-down transistors in the last stage of the sense amplifier function to pull up or pull down the voltage value of the bitline. Therefore, the bitline and the sense amplifier output are virtually at the same voltage potential. However, the amount of capacitance at the bitline differs from the amount of capacitance at the sense amplifier output. When the sense amplifier is in its fastest operating mode, the amount of capacitive load on the sense amplifier output is very low. However, the bitline node has several memory cell transistors connected to it, plus additional parasitic capacitance, so the capacitive load on the bitline is much higher than on the sense amplifier output. This factor can affect the stability of the sense amplifier output.

When the latch is activated, the bitline is usually precharged at a value of about one-half of Vcc, where Vcc is the voltage corresponding to a digital logic level of "1" or "high". If a logic level of "1" was on the sense amplifier output node, then a capacitive partition occurs when the latch is activated. The sense amplifier output could then have a voltage drop which would vary as a function of the number of cells that are connected to the bitline. This occurrence is a transient glitch which causes the sensing circuit to react and pull up the voltage on the sense amp output node back to the logic "1" level. However, since there is a brief increment of time before the transient is corrected by the sensing circuit, the transient can potentially cause problems in the operation of the memory cell. In cases in which the sequence timing is critical, the data could be strobed at the same time as when the transient occurs.

This could cause the incorrect data to be read, such that a logic "1", signal could be read as a logic "0" signal, or vice versa, and would cause the incorrect data to be processed. Therefore, it is important to attempt to eliminate these transients in order to avoid the erroneous operation of the memory circuit.

It is the object of the present invention to provide a sense amplifier that provides stability to the data latched at the output node and prevents transients that could result in malfunctioning of the memory circuit in which it is used.

It is a further object of the invention to provide a sense amplifier that operates with fast speed and with low power consumption.

SUMMARY OF THE INVENTION

The above objects have been achieved by a sense amplifier having a sense line transistor which isolates the sense amplifier output from the impedance of the bitline, thus eliminating or substantially attenuating any transients which may cause erroneous data reads. The sense amplifier also includes an input node for receiving a data signal from a bitline of a memory cell, an output node for producing a sense amp output signal, an enable signal input for receiving an enable signal which triggers circuitry within the sense amplifier, a sensing circuit for sensing the data content of a memory cell and a latching circuit for holding the voltage value of the sense amplifier output. The sense line transistor is connected between the sense amplifier output and the input node in order to increase the strength of the output node and serves to isolate the sense amplifier output from the bitline. Additionally, the sense amplifier of the present invention achieves a power savings because the bitline does not have to be discharged or precharged due to the addition of the sense line transistor. This also helps to improve the speed of the sense amplifier, which is a important factor, as several sense amplifiers would usually be incorporated into a memory circuit.

BRIEF DESCRIPTION OF THE DRAWINGS

FIG. 1 is a block diagram of the sense amplifier of the present invention.

FIG. 2, consisting of FIGS. 2A and 2B, is an electrical schematic diagram of the sense amplifier of the present invention.

BEST MODE FOR CARRYING OUT THE INVENTION

With reference to FIG. 1, a preferred embodiment of the sense amplifier 15 of the present invention includes a sense input node 20 which is connected to a bitline of a memory cell array. An enable signal 30 is supplied to a sensing circuit 35 which is used to detect and determine the data content of the memory cell to which the sense amplifier 15 is connected. The enable signal 30 is used to control the operation of the sensing circuit. The output 38 of the sensing circuit 35 is supplied to an amplifying circuit 45 which converts the arbitrary voltage level of the bitline to a standard digital logic level which is compatible with any peripheral circuits which are connected to the sense amp output 40. Optionally, one or more buffering circuits 55 may be connected after the amplifying circuit 45 in order to provide a more stable output to the sense amp output node 40. Additionally, a latch control circuit 60 is connected between the sense input node 20 and the sense amp output 40. The sensing circuit 35, amplifying circuit 45, buffering circuit 55 and latch control circuit 60 constitute a latch circuit for storing the voltage value of the sense amplifier output so that the voltage level is held for a longer period of time than the regular memory cycle. Also, by latching the output, the remainder of the sense amplifier can be turned off or idled until it is required to be turned on again. This provides a beneficial result in that a great amount of power can be saved. The output 67 of the latch control circuit 60 is supplied back to the input of the sensing circuit 35. A sense line transistor 50 is connected between the latch control circuit 60 and the sense line input 20 to isolate the sense amp input 20 from the sense amp output 40.

With reference to FIG. 2, the sensing circuit includes a pair of inverters, the first inverter consisting of transistors P101 and N101 and the second inverter consisting of transistors P102 and N102. Throughout the following description of the sense amplifier circuit, transistors designated with a "P", such as P101 and P102, are p-type MOS transistors, while transistors designated with an "N", such as N101 and N102 are n-type MOS transistors. Transistors P101 and N101 have gate terminals which are connected together to form the input of the sensing circuit and receive the output 67 of the latch circuit. Transistors P102 and N102 form a second inverter having gate terminals electrically connected together and electrically connected to the input of the sensing circuit. The source terminal of transistor P101 is connected to an external voltage source, Vcc, 70 which is the voltage value for the digital logic circuits used at the periphery of the sense amplifier. The source terminal of transistor N101 is connected to a ground potential 80. The outputs of both of the inverters result on a sense line 38.

The second inverter, consisting of P102 and N102, is connected to a pair of boost transistors P121 and N121. Boost transistor P121 is electrically connected between the source terminal of transistor P102 and the external voltage source, Vcc, 70. Boost transistor N121 is electrically connected between the source terminal of transistor N102 and ground 80. Boost transistor P121 receives a first boost enable signal, BOOST#, at its gate terminal 32 and boost transistor N121 receives a second boost enable signal, BOOST, at its gate terminal 31. The boost enable signals, (BOOST, BOOST#), set the sensing speed of the circuit. The second boost enable signal, BOOST, is 180 degrees out of phase with the first boost enable signal BOOST#. A sense enable signal SAEN# is supplied at node 30 to the gate terminal of a sense enable transistor P131.

The sensing circuit also includes a first feedback path consisting of a first feedback transistor N133 having a gate terminal electrically connected to the output of the second inverter (P102, N102), having a drain terminal connected to the drain terminal of the sense enable transistor P131, and having a source terminal electrically connected to the sensing circuit input. The sensing circuit also includes a second feedback path including a pair of feedback transistors N132 and N131 connected in series. Transistor N132 has a gate terminal connected to the sense line 38, a drain terminal connected to the drain terminal of transistor P131 and to the drain terminal of transistor N133, and has a source terminal connected to the drain terminal of transistor N131. Transistor N131 has a source connected to the sense input line 20 and receives the second boost enable signal, BOOST, at its gate terminal. Transistor N133 is a NMOS transistor that does not have threshold voltage ($V_T$) enhancement, which allows for the proper biasing of the transistor to be set more easily. Transistor N133 has a low W/L ratio and so is of a small size. In general, a higher W/L ratio corresponds to a lower change in the voltage between the gate and source for a given current. Therefore, if the voltage swing is lowered at the same time, then the initial response of the transistor will be slower. Because the W/L ratio of transistor N133 is low, the response time of the transistor will be fast. Transistor N132 is an enhancement transistor placed in the second feedback path in parallel with transistor N133. The transistor N132 operates when the second boost enable signal, BOOST, is "high", turning on the switch transistor N131, to the second feedback path. In operation, transistor N132 would only contribute current when the voltage difference between the bitline and the sense output line is close to its threshold voltage. The effect of this is that transistor N133 operates with an initial fast response and then the transistor N132 contributes current to the column as the voltage approaches the threshold voltage, serving to control the voltage swing.

The sense amplifier of the present invention also includes an amplifying circuit having an inverter consisting of transistors P103 and N103. Transistor P103 has a gate terminal connected to the sense line 38, a source terminal connected to voltage source Vcc 70, and a drain terminal connected to the drain terminal of transistor N103. Transistor N103 has a source terminal connected to ground 80 and a gate terminal connected to the sense line 38. The output of the inverter (P103, N103) goes to a sense output line 48.

Optionally buffering circuits can be added to the sense amplifier. The buffering circuits shown in FIG. 2 are a pair of inverters, one buffer inverter consisting of transistors P104 and N104, and a second buffer inverter consisting of transistors P105 and N105. The first inverter (P104, N104) receives an input from the output 48 of inverter P103, N103. Both inverters have the source terminals of the p-type transistor (P104, P105) connected to the voltage source Vcc and the source terminals of the n-type transistor (N104, N105) connected to ground. The output 58 of the first inverter (P104, N104) is provided to the gate terminal inputs of the second inverter (P105, N105). The output of the second inverter (P105, N105) is provided to the sense amp output node 40.

A latch control circuit consisting of transistors P151 and N151 is connected between the sense amplifier output 40 and the sense amplifier input 20. The latch control circuit (P151, N151) receives latch enable signals Lat and Lat# in order to control the latching function. Transistor N151 has a drain terminal connected to the sense amp output node 40, a gate terminal connected to a node 21 which receives a latch signal Lat, and a source terminal electrically connected to the sensing circuit input 67. Transistor P151 has a drain terminal electrically connected to the sensing circuit input 67 and has a gate terminal electrically connected to a node 22 which receives the latch signal Lat#.

The sense line transistor N134 is connected between the output 67 of the latch and the sense amplifier input 20. The sense line transistor N134 has a drain terminal connected to the sense line input 20, a source terminal connected to the latch output 67 and a gate terminal electrically connected to the node 22 receiving the latch signal, Lat#. The sense line transistor N134 serves to prevent the voltage of the output signal stored in the latch from dropping or glitching due to the impedance of the bitline connected to the sense amp input 20. For example, if the output at output node 40 is at a voltage represented by a logic level 1, the impedance of the sense amp input line 20 could possibly lower the voltage on the output node to a voltage level near the switching threshold voltage of the latch. This would create an unstable situation, a transient glitch, which could affect the value of the voltage stored in the latch. The transistor N134 operates to pull up the voltage on the output and serves to isolate the output of the latch from the input line in order to prevent these transients that could affect the reading of the memory cell.

The sense amplifier operates as follows. First, the sense enable signal SAEN# and the latch signals Lat, Lat# set the circuit in either the active read or the latch configuration. For reading, the SAEN# signal is a logic level low, the latch signal Lat is low and the latch signal Lat# is high. For latch operation, the SAEN# signal is high, the latch signal Lat is high and the latch signal Lat# is low. Proper timing for the above signals is provided in order to ensure smooth transition from read to latch operation. The BOOST and BOOST# signals serve to set the sensing speed of the circuit. When in the "boost high" read mode, faster sensing is achieved at the expense of higher power consumption. Alternatively, the signals can operate at a slower speed, "boost low" mode, in order to conserve power. When reading with the BOOST signal high (BOOST# low), the inverters (P101, N101) and (P102, N102) control the feedback transistors N132 and N131, providing a precharge, regulation and first stage sensing for the bitline connected to the sense input node 20. A voltage difference proportional to a first current flowing through sense line transistor N134 forms across the sense-in 20 and sense latch 67 nodes. If the first current is greater than or equal to the specified minimum detection level, then the sense node voltage drives the output of inverter P103 and N103 to a low state. Otherwise, the output of the amplifying inverter P103, N103 stays in a high state. During the read operation, the voltage of the sense latch node 67 is at a precharge level, hence causing the two inverters (P101, N101), and (P102, N102) to burn a static current. When reading in the "boost low" mode (boost# high), the operation is the same as above, except that the inverter consisting of transistors P102 and N102, and the feedback device N132, have been disabled. In this configuration, the sense node has more voltage swing, providing more stability and consuming less power in the circuit.

In the latch mode of operation, latching the state of the sense amp output node 40 provides a way of reducing the power consumption of the circuit to a zero level. The latch signal, lat, goes from low to high, the latch signal, lat#, goes from high to low, and the sense enable signal, SAEN#, goes from low to high. This allows the voltage held in the sense amp output node 40 to be transferred into the sense latch node 67 while the sense amp input 20 is isolated. The generally high capacitive sense amp input node 20 does not have to be charged or discharged by the output drivers P105, N105 due to the sense line transistor N134 isolating it. This allows for a faster, safer and greater power saving latch configuration.

It is understood that changes may be made to the embodiment described above without departing from the broad inventive concepts thereof. Accordingly, the present invention is not limited to the particular embodiments disclosed, but is intended to cover all modifications that are within the spirit and scope of the invention as defined by the appended claims.

What is claimed is:
1. A sense amplifier comprising:
a) a sense amp input node for receiving a data signal from a bitline of at least one memory cell;
b) an output node for producing a sense amplifier output signal;
c) a latch circuit having:
1) an enable signal input node for receiving an enable signal;
2) a sensing circuit electrically coupled between the sense amp input node and the output node and also electrically coupled to the enable signal input node, the sensing circuit having an sensing circuit input to receive the data signal from a sense latch node and receiving the enable signal from the enable signal input node and producing the sense amplifier output signal at the output node:
wherein the sensing circuit has:
(i) feedback paths electrically coupled to the sense enable signal input node;
(ii) inverter circuits electrically coupled to the feedback paths and to the output node;
(iii) boost circuits electrically coupled to the feedback paths;
3) a latch control circuit having an input electrically connected to the output node and forming an output electrically connected to the sensing circuit input, said output being the sense latch node; and
d) a sense line transistor electrically connected between the latch control circuit and the sense amp input.

2. The sense amplifier of claim 1 wherein the latch circuit further comprises:
an amplifying circuit electrically connected between the sensing circuit and the output node.

3. The sense amplifier of claim 2 wherein the latch circuit further comprises:
at least one buffering circuit electrically connected between the amplifying circuit and the output node.

4. The sense amplifier of claim 1 wherein the latch control circuit includes a first and second latch node for receiving a first latch control signal and a second latch control signal, said first and second latch control signals being derived from the enable signal, said first latch control signal being in phase with the enable signal and said second control latch signal being out of phase with respect to the enable signal.

5. The sense amplifier of claim 4 wherein the sense line transistor is an N-channel transistor having a drain electrically connected to the latch control circuit, a source electrically connected to the sense amp input node and a gate receiving the second latch control signal.

6. The sense amplifier of claim 4 wherein the latch control circuit comprises a first p-channel transistor and a first n-channel transistor electrically connected in parallel and each having a gate, and each being electrically connected between the drain of the sense line transistor and the output node, the first n-channel transistor receiving the first latch control signal at its gate and the second n-channel transistor receiving the second latch control signal at its gate.

7. The sense amplifier of claim 1 wherein the inverter circuits include:
a first inverter and a second inverter connected in parallel, each inverter consisting of a p-type transistor and an n-type transistor having gates electrically connected to form an inverter input, and each inverter producing an output on a sense line, the input of the first inverter being electrically connected to the sensing circuit input and the output of the second inverter being electrically connected to the output node:
wherein the boost circuits include a first and second boost transistor, each connected to the second inverter, the first boost transistor being a p-type transistor receiving a boost enable signal at a gate terminal and having a drain terminal electrically connected to the source terminal of the p-type transistor of the second inverter and having a source terminal connected to a voltage source, the second boost transistor being an n-type transistor receiving an inverted boost enable signal at a gate terminal and having a drain terminal electrically connected to a source terminal of the n-type transistor of the second inverter having a source terminal connected to a ground potentials and wherein the sensing circuit further includes a sense enable transistor receiving a sense enable signal at a gate terminal, and having a drain terminal electrically connected to the sensing circuit input and a source terminal electrically connected to the voltage source.

8. The sense amplifier of claim 1 wherein the feedback paths include a first feedback path including a first feedback transistor having a gate electrically connected to the output of the second inverter, having a drain terminal electrically connected to the drain terminal of the sense enable transistor and having a source terminal electrically connected to the sensing circuit input.

9. The sense amplifier of claim 8 further having a second feedback path including a second feedback transistor and a third feedback transistor connected in series, the second feedback transistor having a gate connected to the output of the second inverter, having a drain terminal connected to the drain of the first feedback transistor and having a source connected to a drain terminal of the third feedback transistor, the third feedback transistor having a source terminal connected to the sensing circuit and receiving the inverted boost enable signal at a gate terminal.

10. The sense amplifier circuit of claim 2 wherein the amplifying circuit includes an amplifying inverter having a p-type transistor and an n-type transistor, each having a gate terminal, said gate terminals being electrically connected to each other and to an output of the sensing circuit, said p-type transistor having a source terminal electrically connected to a voltage source and a drain terminal electrically connected to the output node, said n-type transistor having a source terminal connected to a ground potential and having a drain terminal connected to the output node.

11. The sense amplifier of claim 3 wherein the at least one buffering circuit is a pair of inverters.

12. A sense amplifier comprising:
a) a sense amp input node for receiving a data signal from bitline of at least one memory cell;
b) an output node for producing a sense amplifier output signal;
c) a latch circuit having:
1) an enable signal input node for receiving an enable signal;
2) a sensing circuit electrically coupled between the sense amp input node and the output node and also electrically coupled to the enable signal input node, the sensing circuit having a sensing circuit input to receive the data signal from a sense latch node and receiving the enable signal from the enable signal input node and producing the sense amplifier output signal;
3) an amplifying circuit electrically connected between the sensing circuit and the output node;
4) a latch control circuit having an input electrically connected to the output node and having an output electrically connected to the sensing circuit input, said output being the sense latch node; the latch control circuit having a first and a second latch node for receiving first and second latch control signals which determine when the latch control circuit stores the sense amplifier output signal; and
d) a sense line transistor electrically connected between the latch control circuit and the sense amp input, said sense line transistor serving to isolate the sense amplifier output signal from a capacitive load on the sense amp input node.

13. The sense amplifier of claim 12 wherein the latch circuit further comprises:
at least one buffering circuit electrically connected between the amplifying circuit and the output node.

14. The sense amplifier of claim 12 wherein the first and second latch control signals are derived from the enable signal, said first latch control signal being in-phase with the enable signal and said second latch control signal being out of phase with respect to the enable signal.

15. The sense amplifier of claim 12 wherein the sense line transistor is an N-channel transistor having a drain electrically connected to the latch control circuit, a source electrically connected to the sense amp input node and a gate receiving the second latch control signal.

16. The sense amplifier of claim 12 wherein the latch control circuit comprises a first p-channel transistor and a first n-channel transistor electrically connected in parallel and each having a gate, and each being electrically connected between the drain of the sense line transistor and the output node, the first n-channel transistor receiving the first latch control signal at its gate and the second n-channel transistor receiving the second latch control signal at its gate.

17. The sense amplifier of claim 12 wherein the sensing circuit includes:
a first inverter and a second inverter connected in parallel, each inverter consisting of a p-type transistor and an n-type transistor having gates electrically connected to form an inverter input, and each inverter producing an output on a sense line, the input of the first inverter being electrically connected to the sensing circuit input and the output of the second inverter being electrically connected to the output node;
a first and a second boost transistor, each connected to the second inverter, the first boost transistor being a p-type transistor receiving a boost enable signal at a gate terminal and having a drain terminal electrically connected to a source terminal of the p-type transistor of the second inverter and having a source terminal connected to a voltage source, the second boost transistor being an n-type transistor receiving an inverted boost enable signal at a gate terminal and having a drain terminal electrically connected to a source terminal of the n-type transistor of the second inverter and having a source terminal connected to a ground potential; and
a sense enable transistor receiving a sense enable signal at a gate terminal, and having a drain terminal electrically connected to the sensing circuit input and a source terminal electrically connected to the voltage source.

18. The sense amplifier of claim 17 wherein the sensing circuit includes a first feedback path including a first feedback transistor having a gate electrically connected to the output of the second inverter, having a drain terminal electrically connected to the drain terminal of the sense enable transistor and having a source terminal electrically connected to the sensing circuit input.

19. The sense amplifier of claim 18 further having a second feedback path including a second feedback transistor and a third feedback transistor connected in series, the second feedback transistor having a gate connected to the output of the second inverter, having a drain terminal connected to the drain of the first feedback transistor and having a source connected to a drain terminal of the third feedback transistor, the third feedback transistor having a source terminal connected to the sensing circuit and receiving the inverted boost enable signal at a gate terminal.

20. The sense amplifier circuit of claim 12 wherein the amplifying circuit includes an amplifying inverter having a p-type transistor and an n-type transistor, each having a gate terminal, said gate terminals being electrically connected to each other and to an output of the sensing circuit, said p-type transistor having a source terminal electrically connected to a voltage source and a drain terminal electrically connected to the output node, said n-type transistor having a source terminal connected to a ground potential and having a drain terminal connected to the output node.

\* \* \* \* \*